United States Patent [19]
Pryor

[11] Patent Number: 4,696,851
[45] Date of Patent: Sep. 29, 1987

[54] HYBRID AND MULTI-LAYER CIRCUITRY

[75] Inventor: Michael J. Pryor, Woodbridge, Conn.

[73] Assignee: Olin Corporation, New Haven, Conn.

[21] Appl. No.: 811,907

[22] Filed: Dec. 20, 1985

Related U.S. Application Data

[63] Continuation-in-part of Ser. No. 715,446, Mar. 25, 1985.

[51] Int. Cl.⁴ .......................... B05D 5/12; B32B 3/00; B32B 7/02
[52] U.S. Cl. .................................. 428/210; 428/212; 428/901; 427/97
[58] Field of Search ............... 428/209, 210, 212, 901; 427/97

[56] References Cited

U.S. PATENT DOCUMENTS

| | | |
|---|---|---|
| 3,200,298 | 8/1965 | Garibotti . |
| 3,723,176 | 3/1973 | Theobald et al. . |
| 4,247,682 | 1/1981 | Dahl . |
| 4,299,873 | 11/1981 | Ogihara et al. . |
| 4,301,324 | 11/1981 | Kumar . |
| 4,313,026 | 1/1982 | Yamada et al. . |
| 4,385,202 | 5/1983 | Spinelli et al. . |
| 4,388,136 | 6/1983 | Huie et al. ............................ 156/252 |
| 4,407,883 | 10/1983 | Newton ............................... 428/215 |
| 4,491,622 | 1/1985 | Butt . |
| 4,547,408 | 10/1985 | Cassat et al. ........................ 427/375 |
| 4,563,383 | 7/1986 | Kuneman et al. .................. 428/216 |
| 4,574,094 | 3/1986 | DeLuca et al. ....................... 427/96 |
| 4,604,299 | 8/1986 | DeLuca et al. ....................... 427/98 |

FOREIGN PATENT DOCUMENTS 1232621 5/1971 United Kingdom .
1349671 4/1974 United Kingdom .

OTHER PUBLICATIONS

"The Direct Bonding of Metals to Ceramics by the Glass-Metal Eutectic Method", by Burgess et al., J. Electrochemical Society: SOLID-STATE SCIENCE AND TECHNOLOGY, 5/75.
"Packaging", by Jerry Lyman, Electronics, vol. 54, No. 26, 12/81.
"Tab Technology Tackles High Density Interconnections", by Dickson, pp. 34-39, Dec. 1984, Electronic Packaging and Production.

Primary Examiner—John E. Kittle
Assistant Examiner—Patrick J. Ryan
Attorney, Agent, or Firm—Paul Weinstein

[57] ABSTRACT

The present invention is directed to the process of forming a multi-layer or hybrid circuit assembly. The assembly includes at least one ceramic substrate having a layer of foil bonded thereto by a high temperature organic adhesive. The foil may be etched and have a resistive metal alloy tape can be bonded so as to provide a path of precise resistance. Also, layers of foil may be bonded to a substrate and stacked to form multi-layer circuit assemblies.

26 Claims, 15 Drawing Figures

HYBRID AND MULTI-LAYER CIRCUITRY

This application is a continuation-in-part of U.S. patent application Ser. No. 715,446, filed Mar. 25, 1985.

This application is related to U.S. patent application Ser. No. 413,046 entitled "Multi-Layer Circuitry" by Sheldon H. Butt, filed Aug. 30, 1982; U.S. patent application Ser. No. 651,984 entitled "Sealing Glass Composite" by Edward F. Smith, III, filed Sept. 19, 1984 (now abandoned); U.S. patent application Ser. No. 651,987 entitled "Sealing Glass Composite" by Edward F. Smith, III, et al., filed Sept. 19, 1984 (now abandoned); U.S. patent application Ser. No. 707,636, entitled "Pin Grid Arrays" by Michael J. Pryor, filed Mar. 4, 1985 (now abandoned); U.S. patent application Ser. No. 811,908 entitled "Steel Substrate With Bonded Foil" by Richard A. Eppler, filed Dec. 20, 1985 (now abandoned); U.S. patent application Ser. No. 811,905 entitled "Hybrid And Multi-Layer Circuitry" by Michael J. Pryor et al., filed Dec. 20, 1985; U.S. patent application Ser. No. 811,846 entitled "Metal-Glass Laminate" by Charles J. Leedecke et al., filed Dec. 20, 1985; U.S. patent application Ser. No. 811,911 entitled "A Hermetically Sealed Package" by Michael J. Pryor et al., Dec. 29, 1985; U.S. patent application Ser. No. 811,910 entitled "A Method Of Joining Metallic Components" by Michael J. Pryor et al., filed Dec. 20, 1985; U.S. patent application Ser. No. 811,906 entitled "Multi-layer And Pin Grid Arrays" by Michael J. Pryor, filed Dec. 20, 1985; and U.S. Pat. No. 4,491,622 entitled "Composites Of Glass-Ceramic to Metal Seals And Method Of Making The Same" by Sheldon H. Butt, issued Jan. 1, 1985.

While the invention is subject to a wide range of applications, it is particularly suited for hybrid circuitry and multi-layer applications and will be particularly described in those connections. More specifically, the invention is directed to bonding an oxygen-free or deoxidized copper alloy foil to a ceramic substrate with a high temperature polymer adhesive. In one embodiment, the copper alloy foil is etched to form bumps and a resistive metal strip then is bonded to the bumps to form a precise resistive path. In another embodiment, a plurality of substrates having foil bonded thereto are bonded to each other to form multi-layer circuitry.

As the density of integrated circuit (IC) devices, also known as chips, has continued to increase, the chips are often mounted on hybrid circuitry. Despite continued advances in IC design and capability, the hybrid circuitry technology has remained substantially static.

Examples of hybrid circuitry design are described in a number of patents including U.S. Pat. Nos. 3,200,298, 3,723,176, 4,247,682, 4,299,873 and 4,313,026. The hybrid substrate is typically a thin and relatively small piece of ceramic material, such as $Al_2O_3$, mixed with an organic binder and formed into a green sheet or substrate. Size is typically limited to a square of about four square inches. Conductive circuitry on the hybrid substrate may be formed by first silk screening a paste of gold, glass and a binder in any desired pattern onto a surface of the green ceramic substrate. The resulting assembly is fired at about 850° to first drive off the binder from the paste and then to sinter the glass and the gold. The fired glass-gold conductor has only about 60% of the electrical conductivity of bulk gold. Resistors are applied by similar techniques, i.e. print screening of a resistor paste, and utilize such resistive materials as ruthenium oxide and carbon. Because of non-uniformities in the geometry of the resistors and because of local variations in their composition, the resistors must be individually measured and laser trimmed to an acceptable resistance range, a most expensive and time consuming procedure. Both resistor and conductor technology using thick film pastes also suffer from lot to lot variations of the pastes themselves. The very high cost associated with this thick film technology has inhibited its use where viable alternatives are available. However, the requirement for increasing the density of IC devices has forced its increased use despite all of the disadvantages enumerated above.

An alternative process involves thin film technology where nichrome resistors and conductors are vacuum evaporated or sputtered onto 99% alumina substrates. These techniques are even more expensive because of the very slow deposition rates of the resistors and conductors and because of the very high price of the 99% alumina substrate material.

To overcome the requirement for high cost gold conductors, there have been ongoing attempts to replace the gold paste with copper foil. One advantage to this substitution would be the ability to form more precise circuitry using dry film photoresist and conventional printed circuit board etching techniques. Dry film photoresist and conventional printed circuit etching are excellent techniques to produce accurate, reproducible and comparatively fine line circuitry on a copper layer bonded to a ceramic substrate. For example, 3 mil line widths on 3 mil spacings are relatively easy to generate using the above mentioned techniques. By contrast, the best results from silk screened gold pastes is a 10 mil line width and somewhat more than 10 mil spacing. Also, cost comparisions are enormously favorable with forming circuitry in a copper layer.

Up until now, attempts to bond copper foil to alumina with glass under reducing conditions have invariably resulted in extensive blistering of the foil. This is due in part to the common use of CDA 11000 foil which contains cuprous oxide as a separate phase. When fired in a reducing atmosphere, the cuprous oxide in the alloy CDA 11000 is reduced and steam blistering results. It is also thought that blistering partially results from air entrapment in the glass due to the lack of a significant avenue of escape during the firing cycle. Blistering is particularly detrimetnal for multi-layer and hybrid circuitry because it creates a weak bond between the ceramic substrate and the copper foil which can lead to delamination. Also, during the etching process, the etching solutions can seep into a blister, at the glass to foil interface, and etch the foil at an undesirable location.

In an attempt to eliminate the problem of blistering, bonding under oxidizing conditions has been attempted as disclosed in a paper entitled "The Direct Bonding of Metals to Ceramics by the Gas-Metal Eutectic Method" by Burgess et al., published in *J. Electrochemical Society: SOLID-STATE SCIENCE AND TECHNOLOGY*, May, 1975. This technique has attempted to take advantage of the high temperature cuprous oxide formed on the foil. Although this approach produced good bonds without blistering, it formed a high temperature cuprous oxide film on the outer surface of the foil; this film is extremely difficult to remove.

The present invention also relates to multi-layer circuitry of which pin grid arrays or side brazed packages are typical examples. Pin grid arrays are typically small, multi-layer 96% alumina boards with conductive circuitry between the layers. The pin grid array minimizes the size required for large integrated circuits and permits the use of higher pin counts than possible with conventional quad packs. Side brazed packages are similar in construction to pin grid arrays except that electrical contact to the electrical circuitry is with pins brazed onto the side of the package. Both of these package designs provide rugged, reliable, hermetic packages and are preferable to CERDIPs because they are not dependent on glass encapsulation of the leads.

Conventional pin grid arrays typically contain at least three layers of alumina made by the tape cast process. The interlayer circuitry is fabricated with tungsten or moly-manganese powder silk screened onto a greem alumina tape (96% $Al_2O_3$). The interconnects between the interlayer circuitry are provided through approximately about 15-10 mil holes punched in the green alumina tape. The interconnect or through-hole conductors are also formed with tungsten or moly-manganese powder. The multi-layer alumina tapes and conductor paths are co-fired in the region of about 1550°-1600° C. This expels the polymeric binder from the alumina tape, sinters the 96% $Al_2O_3$ and produces partial sintering of the current carriers. The exposed conductors may then be coated with nickel by an electroless process. Thereafter, gold plates lead pins are brazed to the through-hole conductors.

There are a number of costly, technical problems in manufacturing pin grid arrays using the foregoing technology. The most serious technical problem is the very large volume contraction of the alumina tape when it is fired at high temperatures. The volume contraction can be as much as 20% and results in a linear contraction of almost 7%. This causes severe problems in the location of the through-holes relative to the pins and also in maintaining through-hole electrical contact. In some cases, the contraction is so high that the conductive transverse circuitry misses the pin altogether. The conventional means of silk screeing the interlayer circuitry on the alumina tape results in circuitry which is relatively dense and well sintered. However, the through-hole contact, which may be inserted mechanically, can be very loose and provide only low frequency particle to particle contact.

In the past, glass-ceramic structures with circuit patterns embedded therein were disclosed in U.S. Pat. No. 4,385,202 to Spinelli et al.; U.S. Pat. No. 4,301,324 to Kumar et al.; U.S. Pat. No. 4,313,026 to Yamada et al.; British Pat. No. 1,232,621 and British Pat. No. 1,349,671. Each of these patents specifically differs from the present invention in that they fail to teach or suggest the bonding of a deoxidized or oxygen free copper or copper alloy foil to a ceramic substrate with a relatively high temperature polymer adhesive.

Multi-layered alumina circuit boards, whose layers are formed with the process of the present invention, are particularly useful as pin-grid arrays of the general type disclosed in the article entitled "Packaging" by Jerry Lyman, *Electronics,* Vol. 54, No. 26, Dec. 29, 1981.

It is a problem underlying the present invention to form a hybrid or multi-layer circuit board assembly wherein one or more layers of copper alloy foil are bonded to one or more layers of ceramic substrate without forming blisters or bubbles at the interface between the foil layer or layers and the ceramic substrate(s). An additional problem relates to the production of resistors on hybrid circuits which are accurate and easy to manufacture.

It is an advantage of the present invention to provide an improved hybrid or multi-layer assembly and a process of forming hybrid or multi-layer circuit assemblies which obviate one or more of the limitations and disadvantages of the described prior processes and arrangements.

It is a further advantage of the present invention to provide an improved hybrid or multi-layer assembly and a process of forming a hybrid or multi-layer circuit assembly wherein a least one deoxidized or oxygen free copper alloy foil is bonded to a ceramic substrate with an organic adhesive at a process temperature of above about 350° C.

It is a still further advantage of the present invention to provide an improved hybrid or multi-layer assembly and a process of forming a hybrid or multi-layer circuit assembly having electrical circuitry and a resistor formed of a metal foil which is bonded to the circuitry in accordance with the teachings of the present invention.

Accordingly, there has been provided an improved hybrid or multi-layer circuitry and the process of forming a multi-layer or hybrid circuit assembly. The assembly includes at least one ceramic substrate having a deoxidized or oxygen free copper alloy foil bonded thereto by a high temperature organic adhesive. The copper alloy foil may etched and a resistive metal alloy tape can be bonded thereon so as to provide a path of precise resistance. Also, layers of foil may be adhesively bonded to a substrate and stacked to form multi-layer circuits.

The invention and further developments of the invention are now elucidated by means of the preferred embodiments in the drawings.

DETAILED DESCRIPTION OF THE DRAWINGS

Figure 1:
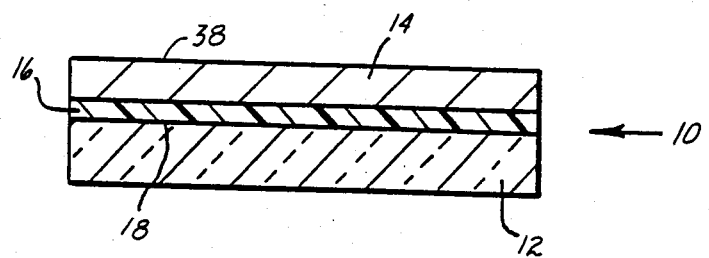
FIG. 1 illustrates a copper alloy layer bonded to a ceramic substrate with a high temperature organic adhesive.
Figure 3:
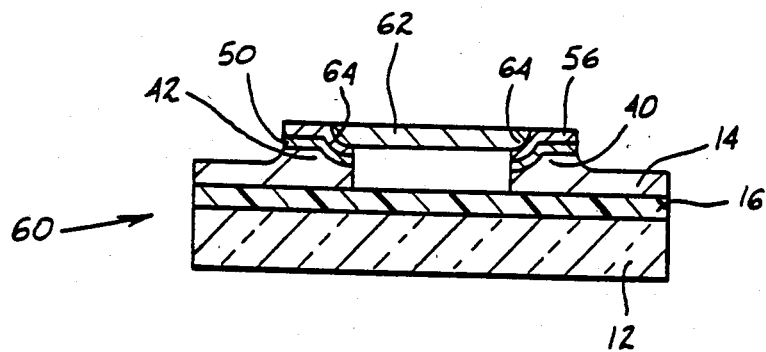
FIG. 3 illustrates a side, cross-sectional view of a resistance tape bonded between two cladded bumps.

The hybrid or multi-layer integrated circuitry according to the invention will be described with reference to the drawings. In FIG. 1, a layered assembly 10 is illustrated having a substrate 12 formed of a ceramic material and a cladding layer 14 of a copper foil. The substrate and the cladding layer are bonded together by a polymer adhesive 16. In fabricating the assembly 10, a coating of the adhesive may be coated on at least one surface of the substrate 12. Then the cladding layer 14 is disposed on the coated surface and the assembly is reheated so that the glass coating is subjected to a laminating pressure so that the adhesive bonds the cladding layer to the ceramic substrate. Finally, circuitry may be etched into the clad layer. The circuitry may be modified to form a hybrid circuit as shown in FIG. 3. Alternatively, the layered assembly may be stacked with one or more additional layers to form a multi-layer assembly as illustrated in FIG. 5D.

The assembly 10, as illustrated in FIG. 1, provides an alternative to the typical hybrid substrate because of the replacement of the thick film paste, typically used to form the circuitry, with a laminated copper or copper alloy foil. The laminated foil is preferably etched by conventional photo-etching techniques.

The substrate 12 may be formed from an unfired ceramic sheet (green sheet) which may be constituted of materials including calcium aluminate, silicon carbide, zirconia, zircon, beryllia, alumina having a purity of about 90 to about 99%, and mixtures thereof. Preferably, the ceramic material is a commercial 96% alumina which typically includes about 94.5% $Al_2O_3$ and the remainder including silica, manganeses, calcium, and magnesium. It is also within the terms of the present invention to use combinations of the ceramic materials mentioned above or other ceramic materials as desired.

The cladding 14 is preferably a copper or copper alloy having an electrical conductivity of more than about 60% IACS. This high conductivity copper alloy preferably has alloy additions which make up less than about 10% of the alloy and the remainder being copper. Examples of copper alloys which are thought to be suitable for practicing this invention include CDA 15100, CDA 12200, CDA 10200, and CDA 19400. The selected copper alloy cladding material is preferably a foil, such as one ounce foil, which has been deoxidized. Using a deoxidized copper alloy foil is particularly important to prevent blistering within the foil or at the interface with the glass 16 as will be further described herein.

It is also within the terms of the present invention to select the copper cladding 14 from an oxygen free copper which is typically an electrolytic copper substantially free from cuprous oxide and produced without the use of residual metallic or metalloidal deoxidizers. Generally, the composition of oxygen free copper is at least 99.95% copper with silver being considered as copper. Examples of this oxygen free copper include CDA 10100, CDA 10200, CDA 10400, CDA 10500 and CDA 10700.

Typically, alumina is used as substrate 12 because its coefficient of thermal expansion (CTE) is relatively close to both the die and the chip carrier which are ultimately attached to the hybrid circuit. The die attachment considerations are not necessarily critical in determining the material of the substrate since the die attach is usually done with epoxies. A smaller amount of die attachment is done with solder and a very small amount of die attachment with gold silicon eutectic. Die attachment using gold silicon eutectic is done at a temperature of about 400°. The high temperature eutectic is required because the hybrid circuit may be hermetically sealed and exposed to glass sealing temperatures in excess of about 400° C. Thus, even if thick film circuitry was not required, the substrate could still be exposed to sealing temperatures in excess of about 400° C. and typically about 430° C. In the event that a conventional epoxy is used to attach the die, the maximum thermal exposure which the substrate would see is about 150° C. There are many polymeric adhesive materials which would effectively bond a layer of copper foil to a ceramic layer and still maintain its structural integrity at or below the temperature of about 150° C. However, the resulting structure would not be able to withstand the processing temperatures of about about 400° which are required to hermetically seal the resulting circuitry assembly with a sealing glass.

The embodiment, as illustrated in FIG. 1, is specifically directed to applying a polymer sealing material which allows the final circuit assembly to be exposed to the higher temperature required for gold silicon eutectic bonding of a chip. The substrate 12 of the assembly 10 is preferably a thin alumina substrate 12 formed of the material described herein. It is thought that the substrate would strongly adhere to the polymeric material because of the comparatively rough and porous nature of the ceramic, typically 96% alumina. Further, it is thought that the polymeric material would also bond successfully to the smoother 99% alumina.

The polymeric material 16 used to bond the substrate and the alloy layer is preferably a crystalline or glassy, engineering thermoplastic preferably having a processing temperature of above about 350° C. More preferably, the processing temperature of the thermoplastic would be from about 350° to about 500° C. The polymeric material is selected from the group consisting of polyetheretherketones, polyaryletherketones and polyarylethersulfones. A commercially available form of polyetheretherketones is PEEK ® manufactured by the ICI Chemical Specialties Company. This polymer material melts at approximately 327° C. although at this temperature its viscosity is rather high. However, it is a thermodynamic liquid at a process temperature of preferably from about 360° to about 450° C. If desired, the polyetheretherketone may be modified by the addition of fillers, such as for example, alumina, glass or quartz, to adjust its thermal expansion. The use of a polymer is additionally attractive because it is compliant and reduces any stability problems which might exists between the substrate and the copper alloy layer due to differences in the coefficients of thermal expansion of the respective materials.

Other polymers which may be particularly useful in the present invention, are disclosed in U.S. Pat. No. 4,247,682 to Dahl and include any polymer of the general formula:

wherein M and D, which can be the same or different, are independently

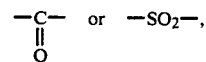

wherein each Ar is independently

wherein L is

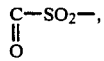

phenyleneoxy,

a covalent bond or T, wherein T is as defined below and each Ar' is independently

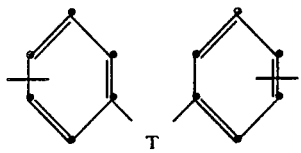

wherein T is O, S, phenyleneoxy, or —CR₂— wherein R is as defined below, or —O—Ar—O— wherein Ar can have any of the values set forth above and wherein R' and R" are independently

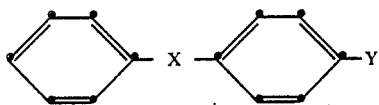

wherein X is a covalent bond, —O—, —S—, or —CR₂— wherein each R is independently hydrogen, an alkyl or fluoroalkyl group, preferably of 1 to 10 carbons, phenyl or an electron withdrawing group substituted phenyl, Y is CN, NO2,

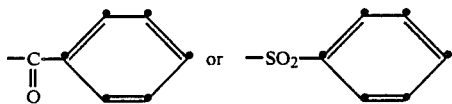

or if X is a covalent bond, Y can be hydrogen as well as any of the foregoing; or Ar"CO— or Ar"SO₂— wherein Ar" connotes phenyl, phenoxyphenyl, naphthyl, biphenyl or terphenyl either unsubstituted or substituted with one or more electron withdrawing substituents such as halogen, nitro, or cyano, provided that when Ar" is phenoxyphenyl there shall be at least one electron withdrawing substituent on the phenoxy moiety and wherein k is the number of repeating units in the molecule and process for the preparation thereof.

The process of constructing the circuit assembly 10 first requires the polymer 16 to be applied to the substrate 12. This is preferably accomplished by heating the substrate to the processing temperature of above about 350° C. and preferably about 350° C. to about 500° C. A relatively thin coating of the polymeric material is applied as either a powder or a film to the surface 18 of the substrate. Melting will be effected either before or after application. Then, the coated substrate may be cooled so that the polymer solidifies. Next, the copper layer 14 is disposed against the polymer layer and the entire assembly is heated to the processing temperature from about 350° to about 500° C. This may be achieved in a single heating step process as well. The entire assembly may be subjected to a laminating force or pressure of about 100 to about 200 psi so that the polymer becomes a thin film of any desired thickness. Upon cooling the assembly, the polymer dries and bonds to both the substrate and the cladding layer. Although the coating is described as being applied to the substrate, it is also within the terms of the present invention to apply the polymer coating to the cladding layer. Another convenient way of forming the structure 10 would be to place a thin unmelted layer of polymer material between the substrate and the cladding layer. Then the entire assembly could be heated and placed under pressure, in the manner described herein, so that the polymer layer would first melt and bond the substrate to the cladding layer as the assembly is cooled and the polymer solidifies.

After the assembly 10 is completed, electrical circuitry may be formed in the clad layer 14 by any desired technique such as conventional photo-etching. More details about forming circuitry with the photo-etching process and a unique means of providing resistance on the circuitry is described herein.

Figure 2A:
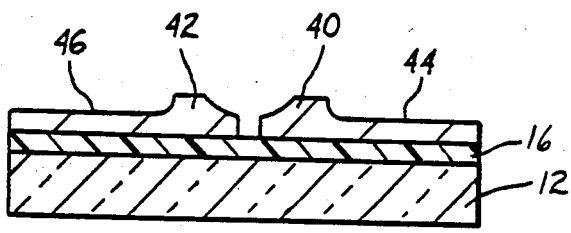
FIGS. 2A-2C illustrate the series of steps to etch bumps on copper alloy layer and coat the bumps with a precious metal coating.
Figure 2B:
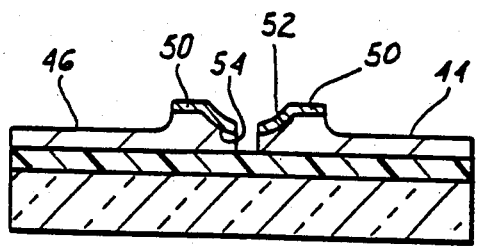
Figure 2C:
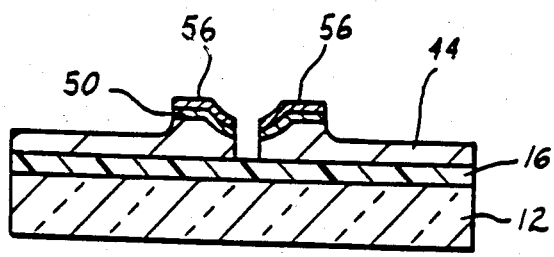

Referring to FIGS. 2A-2C, there are illustrated the stages in which the structure incorporating the embodiment illustrated in FIG. 1 may be processed to form the desired electrically conductive circuitry. For purposes of illustration only, the sealing material is polymer adhesive 16, although it is within the terms of the present invention to substitute a different sealing material such as glass. The outer surface 38 of the assembly 10 is first coated with a positive photo-resist which may consist of a light sensitive resin of the photodegradable type. Then, a prescribed patterned mask of material, opaque to exposing light, is placed in contact with the photo-resist. On light exposure, only the unmasked portion of the photo-resist layer gets exposed. The mask is then removed and the resist is developed. The exposed portions of the resist are removed and the circuit pattern is formed in the layer of foil in a subsequent etching process. The etching may be accomplished with any conventional solution such as a FeCl₃/HCl copper etchant. The assembly may be coated with photo-resist and etched in this manner several times to produce the desired patterns and structures. In FIG. 2A, the copper layer or foil has been photo etched to leave two bumps 40 and 42 having their outermost surfaces 38 extending above the etched top foil surfaces 44 and 46.

The remaining bumped foil is particularly advantageous for connecting to electrical components such as a resistor described herein. Details of the typical bump formations are described in the article entitled "Tab Technology Tackles High Density Interconnections" by Dickson, pages 34-39, in the December, 1984, issue of *Electronic Packaging and Production*. Although a specific means of forming the bumps has been described hereinbefore, it is within the terms of the present invention to use any other desired manufacturing technique such as machining to form the bumps.

Next, as illustrated in FIG. 2B, a barrier layer 50 is preferably applied to the surface of the bump. If desired, the barrier layer may coat all or part of the remaining surface 44 and 46 of the foil. Note that the barrier layer is illustrated as extending down onto the portions 52 and 54 of the bumps. The barrier layer is provided to prevent diffusion between the copper layer and the precious metal which is to be coated on the surface of the barrier layer as described herein. Also, the barrier layer enhances the bonding of the precious metal to the selected surface of the copper layer. The material selected for the barrier layer may be selected from the group including nickel, titanium, boron nitride and alloys thereof. It is also within the terms of the present invention to use any other barrier layer material which is suitable for preventing interdiffusion between the selected adjacent metals. The barrier layer may be coated onto the surface of each bump, and if desired onto the remainder of the copper layer, by any desired technique such as electrodeposition.

Then, as illustrated in FIG. 2C, the barrier layer is preferably coated with a precious metal layer 56 of material such as gold, platinum, silver, platadium and alloys thereof. The precious metal is coated onto the barrier layer using any desired technique such as electrodeposition.

After the conductive circuitry has been formed, a significant cost resides in the application of the electrical resistors. As described hereinbefore, they typically require electrical monitoring and laser trimming when they are formed by the application of thick film paste. The present invention discloses a unique technique to construct relatively inexpensive, easily reproduced resistors. Specifically, punched foil resistors are attached to the bumped portions of the circuitry by any bonding technique such as conventional thermocopression bonding. The foil of the resistors is preferably made by a conventional metal rolling process where the thickness can be controlled to extremely fine tolerances. Also, the width of the foil can be precisely controlled with precision blanking techniques. Since resistors made of foil are susceptible to extremely precise geometry as well as precise compositional control, they produce a highly reproducible, precise electrical resistance. It is also within the terms of the present invention to form the resistors by photoetching techniques as described herein.

Referring to FIG. 3, there is illustrated an electrical conductive circuit assembly 60 having a strip 62 of resistor foil attached thereto. The circuit is essentially the same as that illustrated in FIG. 2C where a copper alloy conductive foil layer 14 is bonded to a substrate 12 by a polymer adhesive 16. The bumps 40 and 42 are coated with a barrier layer 50 and a precious metal layer 56.

The resistor foil 62 may be formed of a high electrical resistance alloy which is preferably ductile and of reasonably high strength. The resistance of the material is preferably between about 100 to about 1000 ohms per circular mil ft. Examples of suitable materials consist essentially of iron-base alloys, nickel-base alloys and copper-base alloys. A particularly useful alloy is a nickel-chromium-iron alloy such as Nichrome ®, a product of the Driver-Harris Company. The foil may be rolled to a very fine gage of about greater than about 1 mil in thickness. It is also within the terms of the present invention to use a wire which may also have a diameter of greater than about 1 mil. In order to roll the foil down to the desired gage, the material preferably should be rather ductile. Further, it is important that it have enough strength to be conveniently handled after it is formed.

Figure 4:
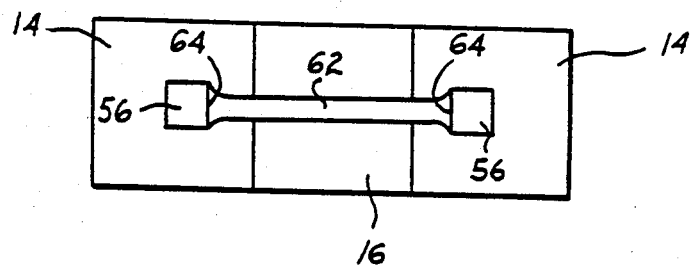
FIG. 4 is a top view of the device of FIG. 3.

Referring to FIG. 4, there is illustrated the top view of the circuit device 60 which illustrates a possible geometry suitable for a resistive foil 62. The edges 64 of the resistive foil which are bonded to the gold coating on the raised bumps 40 and 42 are preferably coated with the same precious material as the coating 56. The resistive foil strip is bonded to the precious metal layer on the bumps by any desired technique such as thermocompression bonding which is typically used in tape automated bonding technology. The ends of the resistive tape which are bonded to the bumps may be wider than the remainder of the tape so that a good bond can be effected while controlling the final electrical resistance of the foil.

Referring to FIGS. 5A through 5E, there is illustrated the stages in which a multi-layer circuit embodying the basic ceramic-adhesive-copper foil layered structure described herein and illustrated in FIG. 1. The reference numerals which are primed and double primed designate components that are essentially identical to the components designated by the unprimed reference numerals described herein.

Figure 5A:
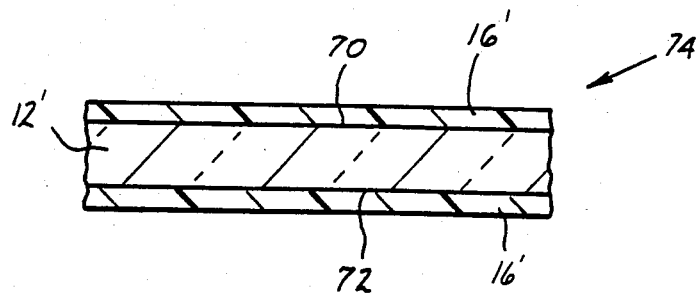
FIGS. 5A-5E illustrate a series of steps for forming a multi-layer circuit bonded by a high temperature adhesive.
Figure 5B:
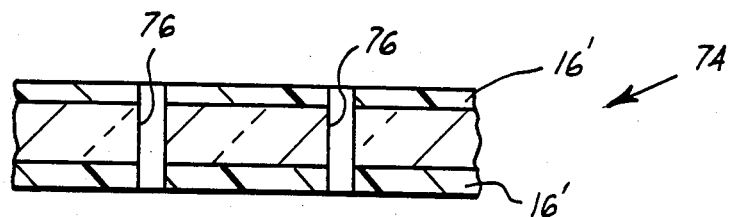
Figure 5C:
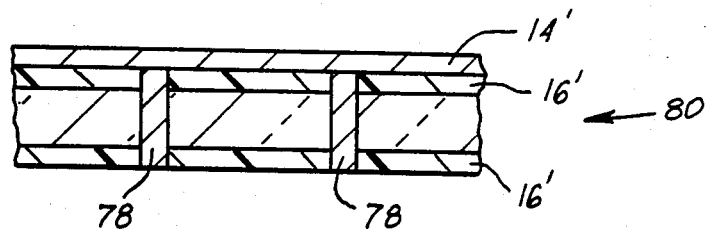
Figure 5D:
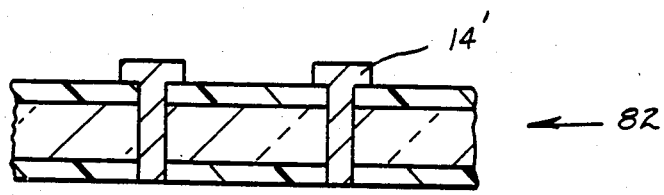

Referring to FIG. 5A, a first ceramic substrate 12' is first coated with a bonding material 16' on opposite outer surfaces 70 and 72 to form a coated substrate 74. The coated substrate is processed to form any number of through-holes 76 in any desired location or pattern, as indicated in FIG. 5B. The through-holes may be formed by any desired technique such as punching or laser drilling. Then, as indicated in FIG. 5C, the through-holes may be filled with a conductor 78 such as a conventional conductive paste, a solid conductive wire or plated by techniques such as electroless plating and/or electroplating and filling with a conductor such as solder. A first layer of metal foil 14' is disposed upon the coating 16'. The resulting assembly 80 is then heated to the bonding temperature is about 350° to about 500° C. while pressing the layer of foil against the adhesive coating 16' under a pressure of between about 50 to about 300 psi.

Figure 5E:
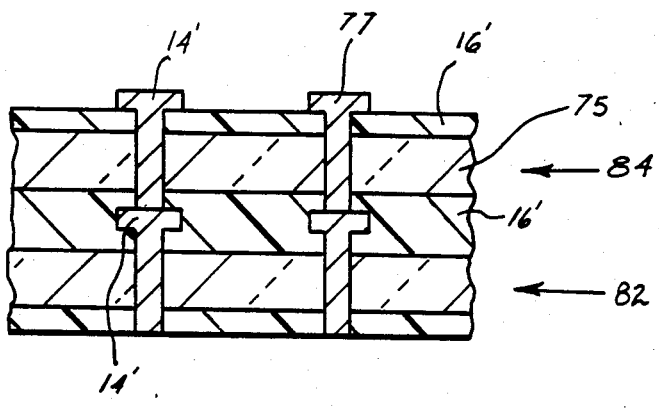

The desired circuitry may now be formed in the foil 14' by conventional techniques such as photo-etching. The resulting structure 82, as illustrated in FIG. 5D, may be stacked together with any number of similarly formed structures. An exemplary structure 84 comprises a second ceramic substrate 75, a polymer 16' and a second layer of metal foil 14'. The structure 84 may be stacked on structure 82 and bonded with the adhesive 16'. If desired an additional layer of adhesive may be disposed between the structures to provide the desired adhesive thickness to form an adequate bond and to simultaneously electrically insulate the matal layers from each other. Then, the structures 82 and 84 can be pressed together and exposed to adhesive sealing temperatures in excess of about 350° C. to form the multi-layer circuitry 85 as shown in FIG. 5E. If necessary the conductor material may be extended from the through holes to contact the intermediate circuitry as required. Further, any additional number of structures, similar to structures 82 and 84, may be stacked on the multi-layer circuitry to form any desired number of layers. Also, pins may be brazed onto the exposed circuitry to interconnect with other electronic devices.

Figure 6:
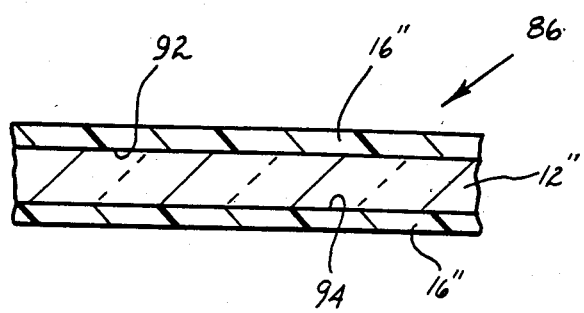
FIGS. 6A-6D illustrate a series of steps for forming a multi-layer circuit bonded by a high temperature adhesive by an alternate embodiment of the method of this invention.
Figure 6:
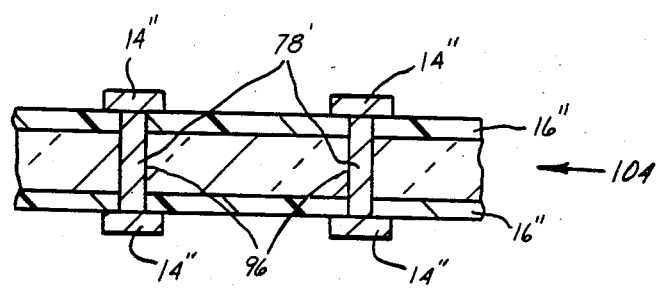
Figure 6:
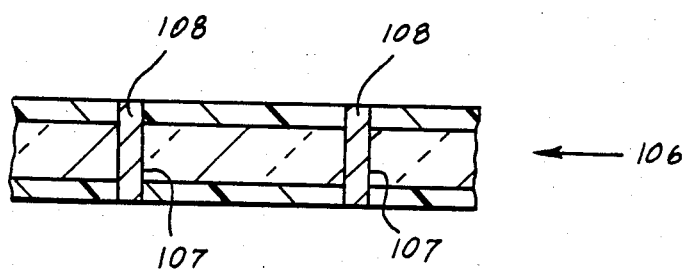
Figure 6:
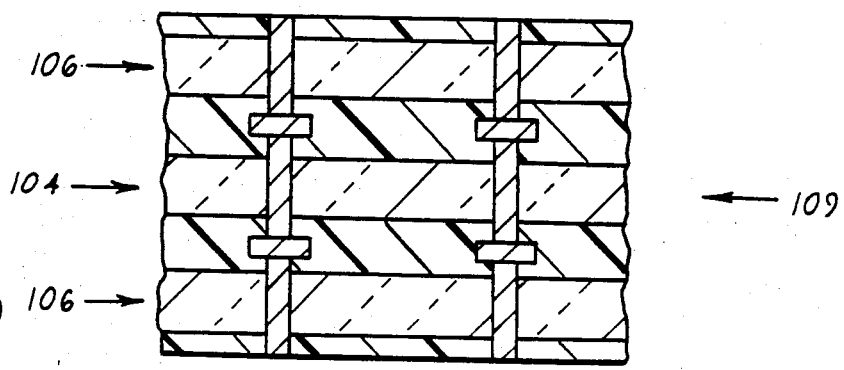

Referring to FIGS. 6A through 6D, there is illustrated the stages of another process, similar to the steps illustrated in FIGS. 5A–5D, to form the multi-layer circuit structure 109 of FIG. 6D. FIG. 6A illustrates a structure 86 formed of a ceramic substrate 12" and layers of adhesive 16". The adhesive 16" is applied to both of the opposite outer surfaces 92 and 94 of substrate 12". The resulting structure 86 may then be further processed in at least two ways.

Referring to FIG. 6B, any number of desired through-holes 96 be formed through the glass and ceramic substrate using any technique such as punching or laser drilling. The holes are filled with a conductive material 78' as described herein. Then, foil layers 14" are bonded to the adhesive layers 16". The foil layers are then etched by any conventional technique to form circuitry of any desired configuration as exemplified by the illustration of structure 104 in FIG. 6B.

The structure 86 of FIG. 6A may alternatively be processed to form a structure 106 as shown in FIG. 6C. In this embodiment, through-holes 107 are first formed by any desired manufacturing technique such as laser drilling or punching. The through-holes 107 may then be filled with a conductor 108 such as a conductive paste, a solid wire or plated and if desired, filled with a conductor such as solder, as described above.

Structures 104 and 106 may be stacked so that one structure 104 is between two structures 106. The layered structure is then heated and pressed together to form a multi-layer assembly 109 as shown in FIG. 6D. The advantage of forming the different structures 104 and 106 is that alternate structures ie., 106 do not require the provision of foil layers or the step of etching. Although three structures are stacked to form multilayer circuit assembly 109, it is also within the terms of the present invention to stack any desired number of alternative layers 104 and 106 to form an assembly with any desired number of circuit layers.

The patents, patent applications and publications set forth in this application are intended to be incorporated by reference herein.

It is apparent that there has been provided in accordance with the present invention hybrid and multi-layer circuitry which fully satisfies the objects, means and advantages set forth hereinabove. While the invention has been described in combination with the embodiments thereof, it is evident that many alternative, modifications and variations will be apparent to those skilled in the art in light of the foregoing description. Accordingly, it is intended to embrace all such alternatives, modifications and variations as fall within the spirit and broad scope of the appended claims.

What is claimed:

1. The process of forming a circuit assembly, comprising the steps of:
   providing a ceramic substrate;
   providing a layer of copper alloy foil having an electrical conductivity of more than about 60% IACS;
   providing a polymeric material having a process temperature from about 350° to about 500° C.;
   disposing said polymeric material between said layer of copper alloy foil and said ceramic substrate;
   heating the assembly of said polymeric material, said layer of copper alloy foil and said ceramic substrate to he process temperature;
   pressing the assembly together at a lamination pressure whereby said polymeric material bonds said layer of copper alloy foil to said ceramic substrate; and
   forming electrical circuitry in the layer of copper alloy foil.

2. The process of claim 1 including the step of selecting the polymeric material from the group consisting of polyetheretherketones, polyaryletherketones and polyarylethersulfones.

3. The process of claim 2 wherein said polymeric material is a polyetheretherketone.

4. The process of claim 2 wherein said polymeric material is a polyaryletherketone.

5. The process of claim 2 including the step of selecting said foil from a copper alloy having alloy additions which make up less than about 10% of the alloy and the remainder being copper.

6. The article produced by the process of claim 1.

7. The article produced by the process of claim 8.

8. The process of claim 2 including the steps of:
   adding fillers to said polymeric material to adjust the coefficient of thermal expansion of the resulting polymeric mixture; and
   selecting said fillers from the group consisting of alumina, glass and quartz.

9. The process of claim 5 including the step of selecting said ceramic substrate from a material of the group consisting of alumina having a purity of over about 90%, calcium aluminate, silicon carbide, beryllia, zirconia, zircon and mixtures thereof.

10. A circuit assembly, comprising:
    a ceramic substrate;
    a layer of copper alloy foil having an electrical conductivity of more than about 60% IACS, said foil having an electrical circuit pattern; and
    a polymeric material having a process temperature from about 350° C. to about 500° C. bonding said ceramic substrate to said copper alloy foil.

11. The circuit assembly of claim 10 wherein the polymeric material is selected from the group consisting of polyetheretherketones polyaryletherketones and polyarylethersulfones.

12. The circuit assembly of claim 11 wherein said copper alloy foil consists essentially of alloy additions which make up less than about 10% of the alloy and the remainder being copper.

13. The circuit assembly of claim 11 wherein said polymeric material has fillers added therein to adjust the coefficient of thermal expansion of the resulting polymeric mixture, said fillers being selected from the group consisting of alumina, glass and quartz.

14. The circuit assembly of claim 13 wherein said ceramic substrate is formed of a material selected from the group consisting of alumina having a purity of over about 90%, calcium aluminate, silicon carbide, beryllia, zirconia, zircon and mixtures thereof.

15. A multi-layer circuit assembly, comprising:
    first and second circuit assemblies;
    said first circuit assembly, comprising:
       a first ceramic substrate;
       a first layer of copper alloy foil; and
       a sealing material comprising a polymeric material having a process temperature from about 350° to about 500° C., said sealing material bonding said first layer of copper alloy
    foil to said first ceramic substrate;
    said second circuit assembly comprising:
       at least a second ceramic substrate; and
       at least a second layer of copper alloy foil, said second layer of foil being bonded to said second ceramic substrate by said sealing material;
    said first and second layers of copper alloy foil having circuitry formed therein;
    said first and second circuit assemblies being stacked on each other with said second layer of copper alloy foil disposed therebetween;
    a layer of said sealing material disposed between said first and second circuit assemblies; and
    said first and second circuit assemblies being bonded together with said sealing material.

16. The multi-layer circuit assembly of claim 15 wherein the polymeric material is selected from the group consisting of polyetheretherketones, polyaryletherketones and polyarylethersulfones.

17. The multi-layer circuit assembly of claim 16 wherein said first and second ceramic substrates are selected from a material of the group consisting of alumina having a purity of over about 90%, calcium aluminate, silicon carbide, zirconia, beryllia, zircon and mixtures thereof.

18. The multi-layer circuit assembly of claim 16 including the steps of:
    adding fillers to said polymeric material to adjust the coefficient of thermal expansion of the resulting polymeric mixture; and
    selecting said fillers from the group consisting of alumina, glass and quartz.

19. The multi-layer circuit assembly of claim 17 further including means for electrically interconnecting said first and second circuit assemblies.

20. The multi-layer circuit assembly of claim 1 further including a third layer of copper alloy foil bonded to said first ceramic substrate;
    a fourth layer of copper alloy foil bonded to said second ceramic substrate;
    means for electrically interconnecting said first and third layers of copper alloy foil; and
    means for electrically interconnecting said second and fourth layers of copper foil.

21. The process of forming a multi-layer circuit assembly comprising the steps of:
    providing at least first, second and third ceramic substrates;
    providing at least first and second layers of copper alloy foil, said copper alloy having an electrical conductivity of more than about 60% IACS;
    providing a polymeric material having a process temperature from about 350° to 500° C.;
    disposing said polymeric material on opposite surfaces of said first ceramic substrate;
    disposing said polymeric material on at least one surface of said second ceramic substrate;
    disposing said polymeric material on at least one surface of said third ceramic substrate;
    disposing at least said first and second layers of foil against the polymeric material disposed on opposite surfaces of the first substrate;
    heating the assembly of the polymeric material, said first and second layers of foil and the first ceramic substrate to the process temperature and pressing the assembly together at a lamination pressure whereby said polymeric material bonds said first and second layers of foil to said first ceramic substrate;
    forming circuitry in said first and second layers of foil;
    stacking said second and third substrates against either side of said first substrate whereby the polymeric material disposed on the second and third substrate contacts one of the first or second layers of foil; and
    heating the assembly of polymeric material, first, second and third substrates and the first and second layers of foil to the process temperature and pressing the entire assembly together at a lamination pressure whereby the polymeric material bonds the substrates and the first and second layers of foil into the multi-layer circuit assembly.

22. The process of claim 21 including the step of selecting the polymeric material from the group consisting of polyetheretherketones, polyaryletherketones and polyarylethersulfones.

23. The process of forming a multi-layer circuit assembly of claim 22 comprising the steps of:
    adding fillers to said polymeric material to adjust the coefficient of thermal expansion of the resulting polymeric mixture; and
    selecting said fillers from the group consisting of alumina, glass and quartz.

24. The process of forming a multi-layer circuit assembly of claim 23 including the step of selecting said ceramic substrate from a material of the grup consisting of alumina having a purity of over about 90%, calcium aluminate, silicon carbide, beryllia, zirconia, zircon and mixtures thereof.

25. The process of claim 24 including the step of electrically interconnecting said first and second circuit assemblies.

26. The process of claim 25 further including the steps of:
    bonding a third layer of copper alloy foil to said first ceramic substrate;
    bonding a fourth layer of copper alloy foil to said second ceramic substrate;
    electrically interconnecting said first and third layers of copper alloy foil; and
    electrically interconnecting said second and fourth layers of copper alloy foil.

* * * * *